United States Patent [19]

Chakradhar et al.

[11] Patent Number: 5,502,647
[45] Date of Patent: Mar. 26, 1996

[54] RESYNTHESIS AND RETIMING FOR OPTIMUM PARTIAL SCAN TESTING

[75] Inventors: Srimat T. Chakradhar, No. Brunswick; Sujit Dey, Plainsboro, both of N.J.

[73] Assignee: NEC USA, Inc., Princeton, N.J.

[21] Appl. No.: 161,221

[22] Filed: Dec. 1, 1993

[51] Int. Cl.$^6$ .................................................. G01R 31/28
[52] U.S. Cl. ........................ 364/489; 364/488; 371/22.3
[58] Field of Search ................................... 364/488, 489; 371/22.1, 22.3, 22.5, 22.6

[56] References Cited

U.S. PATENT DOCUMENTS

| | | | |
|---|---|---|---|
| 5,043,986 | 8/1991 | Agrawal et al. | 371/22.3 |
| 5,132,974 | 7/1992 | Rosales | 371/22.3 |
| 5,166,604 | 11/1992 | Ahanin et al. | 371/22.3 |
| 5,329,533 | 7/1994 | Lin | 371/22.3 |

OTHER PUBLICATIONS

D. Kagaris et al, "Partial Scan with Retiming", in Proc. Design Automation Conference, pp. 249–254, 1993.
D. H. Lee et al, "On Determining Scan Flip–Flops in Partial Scan Designs", in Proc. of the Int'l. Conf. on CAD, pp. 322–325, Nov. 1990.
V. Chickermane et al, "An Optimization Based Approach to the Partial Scan Design Problem", in Proc. of an Int'l Test Conf., pp. 377–386, Sep. 1990.

*Primary Examiner*—Vincent N. Trans
*Attorney, Agent, or Firm*—Philip J. Feig

[57] ABSTRACT

A partial scan methodology selects scan flip flops (FFs) in the minimum feedback vertex set (MFVS) of the FF dependency graph so that all loops, except self-loops, are broken. The MFVS of the circuit, i.e. the minimum quantity of gates whose removal makes the circuit acyclic, is a lower bound and in many cases is significantly smaller than the MFVS of the dependency graph. Since only FFs are considered for scan, FFs are repositioned so that, in a modified circuit, every circuit MFVS gate drives one FF that can be scanned. A method is disclosed by which resynthesis and retiming can always transform any circuit into an equivalent circuit whose FF dependency graph MFVS is equal to the MFVS of the original circuit. Therefore, the MFVS of a circuit is a lower bound on the quantity of scan FFs needed. The necessary and sufficient conditions under which legal retiming can produce the desired FF repositioning are identified. Novel resynthesis transformations are used to modify circuits that do not satisfy these conditions. The modified circuits can always be retimed to achieve the desired FF repositioning. The result is a modified circuit which performs equivalent to the original circuit, but requires fewer scan FFs than the original circuit.

12 Claims, 6 Drawing Sheets

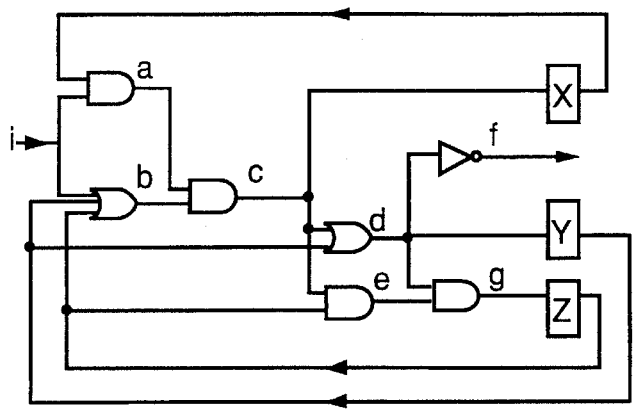
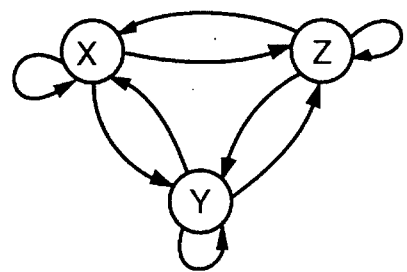
Figure 1(a)
Figure 1(b)
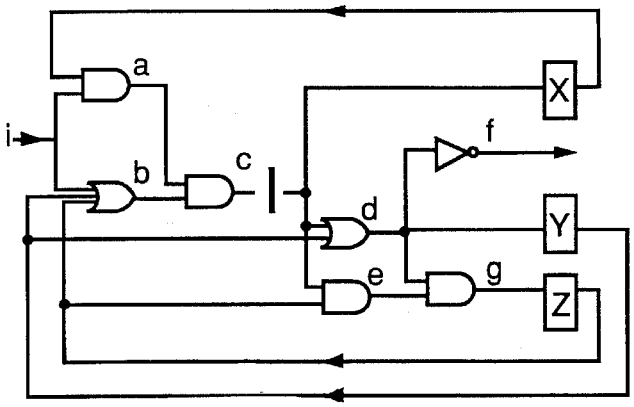
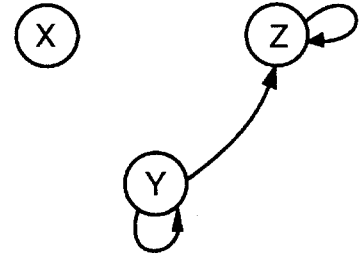
Figure 1(c)
Figure 1(d)

RESYNTHESIS AND RETIMING FOR OPTIMUM PARTIAL SCAN TESTING

BACKGROUND OF INVENTION

The present invention relates to partial scan testing of sequential circuits and specifically to the resynthesis and retiming of the circuit to achieve partial scan testing with fewer scan flip-flops.

Partial scan testing of circuits has evolved as a prevalent design for testability technique for cost-effective sequential Automatic Test Generation methodology (ATPG). The cost associated with the partial scan methodology is related to the number of flip-flops (FFs) that are scanned. The goal of any partial scan approach is to select a minimum number of scan flip-flops such that sequential ATPG achieves high fault coverage. Empirical analysis of several circuits shows that the test generation complexity for sequential circuits grows exponentially with the length of the cycles in the FF dependency graph of the circuit. A FF dependency graph of a circuit captures the signal dependencies among the FFs. The graph has a vertex for every FF and there is an arc from vertex u to v whenever there is a combinational path from FF u to FF v.

An efficient partial scan approach is to select FFs in the minimum feedback vertex set (MFVS) of the FF dependency graph, so that all loops, except self-loops, are broken. While the conventional partial scan approaches consider the position of the FFs fixed, recent approaches investigate repositioning the FFs of the circuit by retiming before selecting the scan FFs. Retiming is a technique to re-position FFs in the sequential circuit without modifing the input-output behavior of the circuit. Several configurations of FFs can be obtained by retiming. It was proposed in an article by D. Kagaris and S. Tragoudas entitled "Partial Scan with Retirelug," in Proc. Design Automation Conference, pages 249–254, 1993, that a binary minimal state configuration (there is no more than one FF at the output of any gate) in which the number of FFs in the circuit is minimum, is the desired retirelug configuration to reduce the number of scan FFs needed to make the circuit acyclic. Techniques were suggested in the article to obtain the binary minimal state configuration from a given initial circuit.

It has been observed that most of the hard-to-detect faults in a sequential circuit occur in moderately sized or large strongly connected components of the circuit. Based on this observation, a retirelug approach was discovered previously by the inventors to improve the testability of the circuit by minimizing the number of FFs in the strongly connected components of the circuit. However, minimizing the number of FFs in the circuit, or minimizing the number of FFs in the strongly connected components of the circuit, may not be able to produce a circuit whose MFVS has the minimum cardinality of all the retiming configurations possible.

In order to understand the advantages of retiming, consider the sequential circuit shown in FIG. 1(a). The corresponding FF dependency graph is shown in FIG. 1(b). The MFVS of the FF dependency graph includes two FFs: either X and Y, or X and Z, or Y and Z. FFs in the MFVS can be scanned so that all cycles, except self-loops, are broken.

The circuit shown in FIG. 1(a) corresponds to a binary minimal state configuration. This is because there is at most one FF at the output of any gate, and the number of FFs in the circuit cannot be further minimized. Consequently, the retiming technique proposed in Kagaris et al cannot, further reduce the number of scan FFs needed to make the circuit acyclic. Also, the number of FFs in strongly connected components of the circuit cannot be further minimized. Consequently, the retiming approach previously proposed by the inventors is also not effective in reducing the size of the MFVS further.

A circuit graph has a vertex for every gate in the circuit and there is an arc between two vertices a and b if gate a drives gate b. The MFVS of the circuit graph is a list of gates whose removal makes the circuit or the circuit graph acyclic. The MFVS of a circuit is clearly a lower bound on the MFVS of the FF dependency graph of the circuit. Therefore, the circuit MFVS serves as a lower bound on the number of flip-flops that have to be selected for partial scan to break all cycles in the FF dependency graph. Referring to the circuit shown in FIG. 1(a), the circuit MFVS includes three gates c, d and e. If these gates are removed from the circuit, the modified circuit becomes acyclic. The corresponding FF dependency graph for the modified circuit also has no cycles. The gates d and e are chosen only to break cycles in the circuit that correspond to self-loops in the FF dependency graph of the circuit. Since high sequential test efficiency can be achieved even in the presence of self-loops, the circuit MFVS need only include gates that eliminate all cycles in the FF dependency graph, except self-loops. In the present invention, consideration is given only to breaking all cycles other than self-loops in the circuit or the FF dependency graph. As an example, consider again the circuit of FIG. 1(a). Including gate c in the circuit MFVS is sufficient to break all cycles in the FF dependency graph. The resultant circuit is shown in FIG. 1(c), and the corresponding FF dependency graph is shown in FIG. 1(d). Note that inclusion of gate c in the circuit MFVS results in eliminating the dependencies between FF and FFs Y, Z. Also, the dependency of FF Y on FF Z is eliminated. The FF dependency graph in FIG. 1(d) has no cycles, except self-loops. Gate c in FIG. 1(a) represents the Circuit Minimum Feedback Vertex Set (CMFVS), the minimum set of gates to be included in the MFVS to break all cycles in the circuit. If it is possible to achieve a circuit configuration in which every CMFVS gate drives a flip-flop, then these flip-flops can be selected for partial scan. Referring again to the circuit in FIG. 1(a), gate c does not drive a FF. Also, there does not exist a retimed configuration in which c drives a flip-flop. This is because FFs Y and Z cannot be moved backward to gate c due to the presence of the fanout from gate d to the primary output (PO), f. Similarly, the presence of the primary input (PI) i to gate b blocks the forward movement of the FFs Y and Z through gate b to the output of gate c.

However, in accordance with the teachings of the present invention, a combination of resynthesis and retiming can achieve the desired configuration. FIG. 1(e) shows the circuit after resynthesis, where gate d has been duplicated, so that there is no path to a PO blocking the backward movement of FFs to the desired location, gate c. The resynthesized circuit in FIG. 1(e) can now be retimed to obtain the desired retiming configuration shown in FIG. 1(f). Note the presence of FF P at the output of the CMFVS gate c. The corresponding FF dependency graph is shown in FIG. 1(g). Since c is the only CMFVS gate, the MFVS of the final circuit includes only one FF, P. Instead of having to scan two FFs in the original circuit in FIG. 1(a), scanning one FF is sufficient to break all cycles, in the resynthesized and retimed circuit shown in FIG. 1(f). The above example demonstrates the feasibility of transforming a circuit, by resynthesis and retiming, to produce a circuit with minimum-cardinality MFVS.

SUMMARY OF THE INVENTION

The present invention discloses a novel method, involving resynthesis and retiming, of generating a circuit with minimum-cardinality MFVS. First, the issue of finding the MFVS of the circuit graph is considered, such that all cycles in the circuit having two or more FFs, under any possible retiming configurations, are broken. Necessary and sufficient conditions needed to be satisfied by the circuit so that retiming can position a FF at the output of each gate in the circuit MFVS are derived. Resynthesis techniques are used to ensure the formation of a circuit which satisfies the necessary and sufficient conditions. A retiming formulation is derived to achieve the desired retiming configuration, while minimizing the combinational and sequential logic overhead required. Experimental results for several large sequential benchmarks have demonstrated the effectiveness of the proposed resynthesis and retiming technique. The number of scan FFs required for the resynthesized and retimed circuit is significantly smaller than the number of scan FFs needed for the original circuits.

A principal object of the present invention is therefore, the provision of a method of resynthesizing and retiming a circuit for generating a circuit with a minimum-cardinality MFVS.

Another object of the invention is the provision of repositioning FFs in a modified circuit such that every circuit MFVS gate drives at least one scannable FF.

A further object of the invention is the provision of modifying a circuit by resynthesis such that retiming of the modified circuit achieves a desired FF repositioning for partial scan testing.

Further and still other objects of the invention will become more clearly apparent when the following description is read in conjunction with the accompanying drawings.

BRIEF DESCRIPTION OF THE DRAWINGS

FIG. 1(a) is a schematic diagram of a sequential circuit useful for describing the principle of the present invention;

FIG. 1(b) is the dependency graph of the circuit shown in FIG. 1(a);

FIG. 1(c) is a schematic diagram of the circuit shown in FIG. 1(a) with the output of AND gate c cut;

FIG. 1(d) is the dependency graph of the circuit shown in FIG. 1(c);

DETAILED DESCRIPTION OF THE INVENTION

Figure 1E:
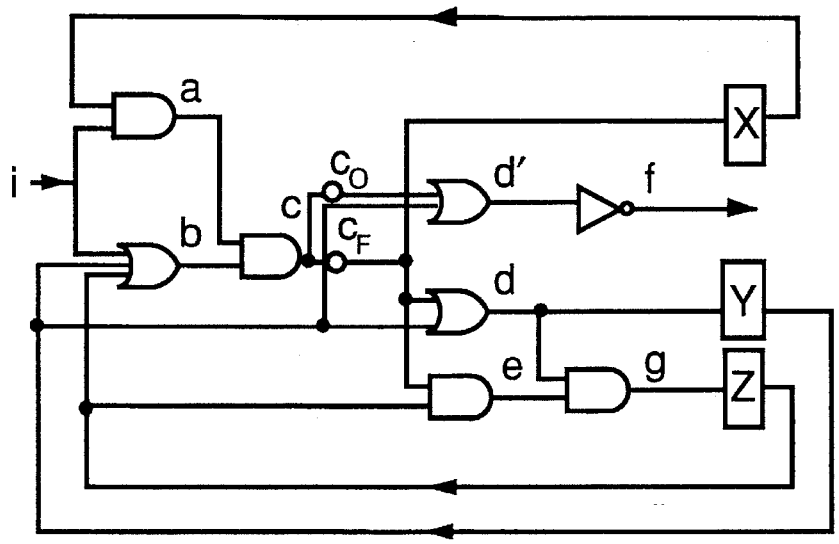
FIG. 1(e) is a schematic diagram of the circuit shown in FIG. 1(a) after splitting the output of AND gate c.
Figure 1F:
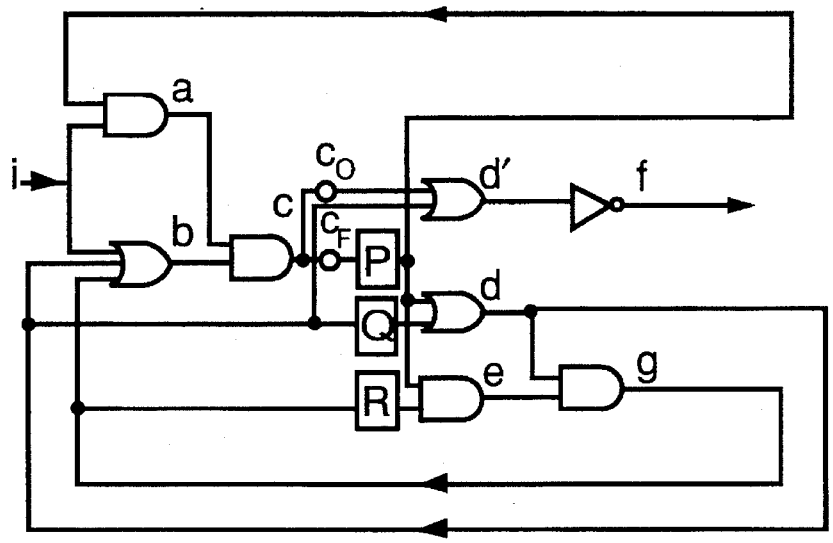
FIG. 1(f) is a schematic diagram of a retimed configuration of the circuit shown in FIG. 1(e)
Figure 1G:
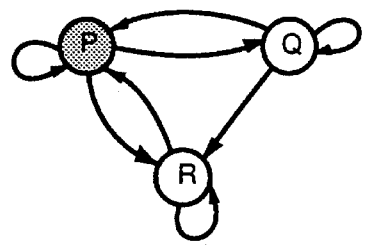
FIG. 1(g) is the dependency graph of the circuit shown in FIG. 1(f)

A brief description of the concepts of retiming and resynthesis will be provided in order to facilitate an understanding of the present invention. A circuit is viewed as an interconnection of combinational logic gates and globally clocked flip-flops. Each flip-flop 2has a single input and a single output and all the flip-flops are clocked by the same periodic waveform. Furthermore, the flip-flop samples its input at a rising (falling) edge of the global clock and the sampled data is available at the flip-flop's output at the next rising (falling) edge of the clock. It is assumed that changes at the output of a flip-flop do not affect the input of another register at the same clock edge. Edge-triggered, master-slave and D-type flip-flops are all examples of such flip-flops. Consider a digital circuit with gates, primary inputs or outputs labeled as $x_1 \ldots x_n$. The circuit is modeled as a circuit graph G which has a vertex $x_i$ for every primary input, primary output or combinational logic gate $x_i$. There is an arc e from vertex $x_i$ to vertex $x_j$ (represented as $x_i \rightarrow^e x_j$) if gate $x_i$ is an input to gate $x_j$. Furthermore, a weight $w_e \geq 0$ is associated with each arc e. Here, $w_e$ is the number of flip-flops between gates $x_i$ and $x_j$.

The process of retiming effectively re-positions the registers or flip-flops (FFs) in a synchronous sequential circuit. Retirelug of a circuit can be specified as a function r() that assigns an integer $r(x_i)$ to every combinational logic gate $x_i$. The integer $r(x_i)$ represents the number of flip-flops to be moved from every fanout of gate $x_i$ to its fanins. Consider an arc $x_i \rightarrow^3 x_j$ with weight w(e). The quantity $r(x_j) - r(x_i) + w(e) \geq 0$ is the number of flip-flops on arc e after retiming and is referred to as the retimed arc weight. A retiming is termed "legal" if all the arcs in the retimed circuit graph have non-negative weights. Also, a legally retimed circuit is functionally equivalent to the original circuit.

Let CMFVS=$\{v_i\}$ be the minimum set of gates or vertices in the circuit graph that have to be scanned to eliminate all loops in the FF dependency graph. Let a circuit configuration that has a FF at the output of each CMFVS vertex be termed as the CMFVS-configuration. It is possible that several retiming configurations may correspond to a CMFVS-configuration. If the current circuit or a retimed circuit corresponds to a CMFVS-configuration, the FFs corresponding to the CMFVS vertices can be scanned to make the FF dependency graph acyclic. The number of FFs thus scanned is minimum for any possible retiming configuration of the circuit. The requirement that a vertex in the CMFVS has at least one flip-flop on all outgoing arcs is referred to as a scan constraint. A CMFVS-configuration satisfies all the CMFVS scan constraints.

In some cases, there may be no retiming configuration that corresponds to a CMFVS-configuration. However, there are necessary and sufficient conditions under which a CMFVS configuration can be reached by legal retiming. Let a cycle be termed a basic cycle if only one vertex is repeated in the cycle. Consider the circuit shown in FIG. 3(a). The basic cycles are: (X,a,b,c,d,X), (Y,a,Y), (Z,a,b,Z), (V,c,e,V), (V,e, V) and (W,c,d,W). The cycle (X,a,b,Z,a,b,c,d,X) is an example of a non-basic cycle.

Figure 3A:
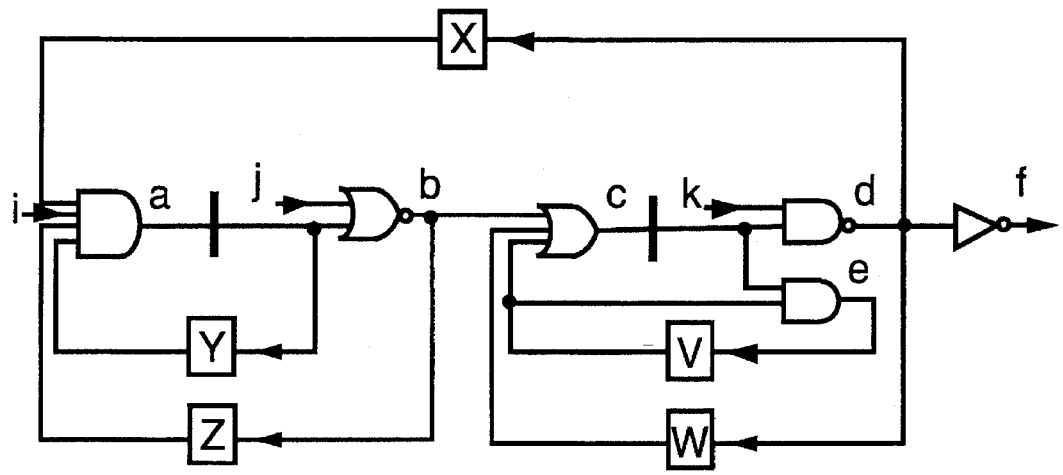
FIG. 3(a) is a schematic diagram of a circuit useful for illustrating resynthesis by output splitting and cycle-splitting.
Figure 3B:
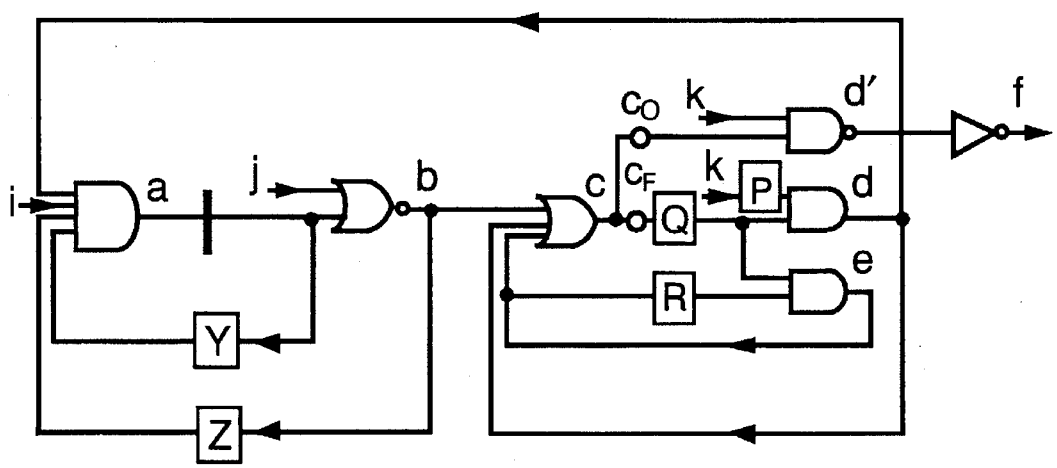
FIG. 3(b) is a schematic diagram of a modification of the circuit shown in FIG. 3(a) which satisfy the scan constraint for gate c.

The minimum set of CMFVS vertices needed for the circuit in FIG. 3(a) is {a,c}, as indicated by the cuts. Note that there is a path from one of the CMFVS vertices, c, to the primary output f. FIG. 3(b) shows a resynthesized circuit where the path from c to PO f has been duplicated, and the CMFVS scan constraint for c has been satisfied by a legal retiming which places the FF Q at the output of c. Similarly, though the CMFVS vertex a has a path to PO f, path duplication can remove the path from a to PO f. However, since the basic cycle C=(X, a, b, c, d, X) has only one FF, and two FFs are needed for the two CMFVS vertices a and c, cycle C does not have sufficient number of flip-flops to satisfy both the CMFVS scan constraints.

The following are the necessary and sufficient conditions to be satisfied by the circuit topology so that the required CMFVS configuration can be achieved by legal retiming. A circuit with the desired CMFVS-configuration can be obtained by legal retiming if and only if the original circuit satisfies the following two conditions:

1. For each CMFVS vertex v, either there is no combinational path from v to any Primary Output, or there is no combinational path from any Primary Input to v.
2. For each basic cycle in the circuit, the number of CMFVS vertices does not exceed the number of FFs.

In accordance with the teachings of the present invention, resynthesis of a circuit can always produce a circuit which satisfies the necessary and sufficient conditions 1 and 2 above.

There are two transformations, "Output Splitting" and "Cycle Splitting," that modify any given circuit into an equivalent circuit satisfying the necessary and sufficient conditions :required by legal retiming to obtain a CMFVS configuration.

Figure 2A:
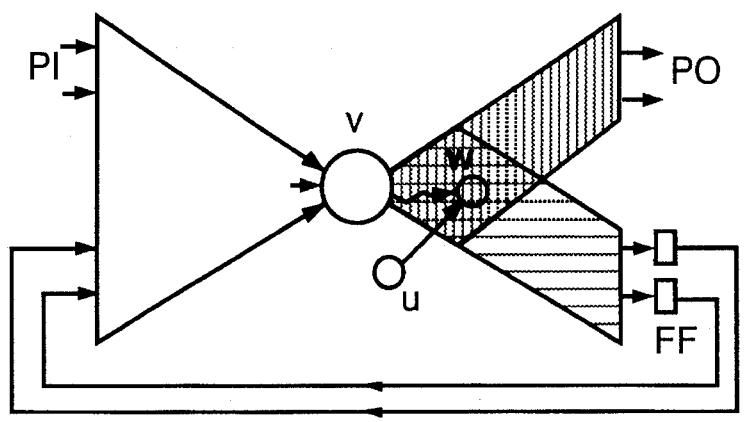
FIG. 2(a) is graphical representation showing a CMFVS vertex v and its input and output cones.

Consider a CMFVS vertex v which does not satisfy condition 1 above. Therefore, v has paths to a set of primary outputs O and/or paths from a set of primary inputs I. FIG. 2(a) shows a CMFVS vertex v, and its input and output cones. The following transformation, termed output splitting, splits the output cone of v such that in the transformed circuit, there is a corresponding vertex $v_F$ which satisfies condition 1 above.

Figure 2B:
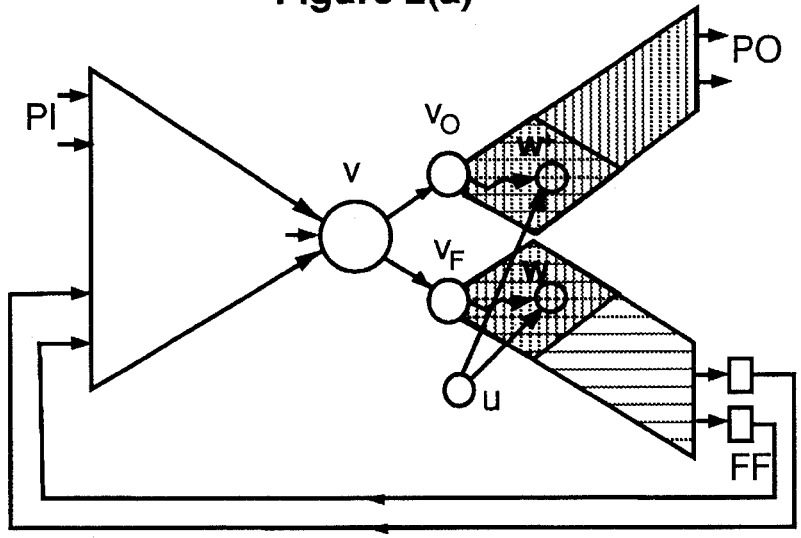
FIG. 2(b) is graphical representation showing a CMFVS vertex v with a split output cone.

Two sub-circuits $P_O$ and $P_F$ are constructed. The output splitting transformation, for the CMFVS vertex v in FIG. 2(a), is shown in FIG. 2(b). Subcircuit $P_O$ consists of vertices and arcs that are exclusively on paths from v to the primary outputs in set O. Similarly, $P_F$ is the sub-circuit consisting of vertices and arcs that are exclusively on all paths from v to the FFs. Note that there may be a vertex w in the output cone of v that has a path both to a primary output and a FF. Therefore, w appears in both sub-circuits $P_O$ and $P_F$. The vertex w is renamed in sub-circuit $P_O$ as w'. After renaming, sub-circuits $P_O$ and $P_F$ have distinct vertices. If any input vertex of w does not belong to the output cone of v, then the input vertex is also connected to the duplicated vertex w'. For example, in FIG. 2(a), vertex u is not in the output cone of v. Since it is an input vertex of w, it is also connected as an input to w'. The output cone of v is then replaced with the two sub-circuits $P_O$ and $P_F$. The fanouts of v are replaced by two new stem vertices, $v_o$ connected to sub-circuit $P_O$, and $v_F$ connected to sub-circuit $P_F$.

All the cycles that go through CMFVS vertex v also go through the new stem vertex $v_F$, and none go through the new stem vertex $v_O$. This is because $v_O$ does not have a path to any flip-flop. Hence, any cycle that can be broken by v can also broken by $v_F$. Vertex $v_F$ replaces vertex v in the CMFVS. Note that $v_F$ satisfies condition 1 above, since it does not have a path to a primary output.

Consider the CMFVS vertex c in the circuit shown in FIG. 1(a). The CMFVS vertex has a path to a primary output f, and two paths from a PI i. Hence, vertex c does not satisfy condition 1 above. The output cone of c consists of the vertices {d, c, f, g}. Output splitting produces the transformed circuit shown in FIG. 1(e), with the sub-circuit $P_o$ having paths to only primary outputs, comprising the vertices {d', f}, and the sub-circuit $P_F$ having paths to only FFs, comprising the vertices {d,c,g}. Note the duplication of vertex d and its fanin edges. The new stem vertex cs replaces c in the CMFVS. The vertex cs satisfies condition 1 above by having no paths to any primary output. Also, if $c_F$ is scanned, all cycles that included the original CMFVS vertex c are broken.

The output splitting transformation can be applied to any CMFVS vertex v that has paths from primary inputs and paths to primary outputs. In the resynthesized circuit, the new vertex $v_F$ satisfies condition 1 above.

Output Splitting results in duplication of combinational logic. To keep the combinational logic overhead low, output splitting should only be performed for CMFVS vertices that have paths from primary inputs and paths to primary outputs. Scan constraints for such vertices cannot be satisfied by retiming alone. Also, output splitting of one CMFVS vertex at a time can lead to unnecessary duplication of logic. A network flow formulation is described below that ensures as little duplication as possible, and provides an algorithm to simultaneously perform output splitting for several CMFVS vertices.

A basic cycle containing more CMFVS vertices than the number of FFs can always be resynthesized, by a process termed cycle splitting, so that the number of CMFVS vertices does not exceed the number of FFs in the cycle (condition 2 above). Let C be a basic cycle with n FFs and m CMFVS vertices in the cycle where m>n. Arbitrarily select n CMFVS vertices on C. If the basic cycles, other than C, containing the n CMFVS vertices satisfy condition 1 above, then the n CMFVS vertices can be always satisfied with the available n FFs, possibly with the help of output splitting. Otherwise, the cycle splitting transformation described below has to be applied to each offending basic cycle (i.e., cycles with more CMFVS vertices than flip-flops).

Consider the remaining m–n CMFVS vertices in C whose scan constraints are not yet satisfied. For each such CMFVS vertex v, there is a set of basic cycles S, which overlap with basic cycle C, and the CMFVS vertex v has been selected to break the basic cycles in the set 8. Consider the longest path from v, P=($v_1$, ..., $v_k$), such that the vertices $v_1$ to $v_k$ are common to the basic cycle C and the set of basic cycles S. The cycle splitting transformation identifies the longest path P, and duplicates the vertices in P to obtain a duplicate path P'. The basic cycle C is split from the other basic cycles S by making the duplicate path P' a part of C, while retaining the old path P for the basic cycles S. The fanouts of v arc replaced by two new stem vertices, $v_O$ connected to the path P' in the basic cycle C, and $v_F$ connected to path P in the basic cycles S. The fanout from the last vertex in the path P, $v_k$, to the vertex of the basic cycle is disconnected. At this point, the basic cycle C has been appropriately split from all other basic cycles S in such a way that the new stem vertex $v_F$ has the following characteristics:

Vertex $v_F$ does not belong to the basic cycle C, and hence adding a FF at its output does not depend on the availability of FFs in C.

Vertex $v_F$ belongs to all the other basic cycles S that the CMFVS vertex v belonged to. Hence, it can break all the cycles S that v was selected to break. Vertex $v_F$ is not necessary to break the cycle C, which can be broken by the other n CMFVS vertices on C that can be satisfied.

From the above characteristics of the new stem vertex $v_F$, it is clear that it can serve as a CMFVS vertex instead of vertex v. Consequently, the number of CMFVS vertices in the basic cycle C is reduced by one. If the number of CMFVS vertices for each basic cycle in S does not exceed the number of FFs in the basic cycle, a FF can be always placed at the output of v. Else cycle splitting can be applied on each offending basic cycle in S, until there is no remaining offending basic cycle. Subsequently, the new CMFVS vertex $v_F$ can be satisfied. The cycle splitting transformation can be applied to each of the remaining m−n CMFVS vertices of the basic cycle C to reduce the number of CMFVS vertices in C to n, the number of available FFs in C.

Figure 3C:
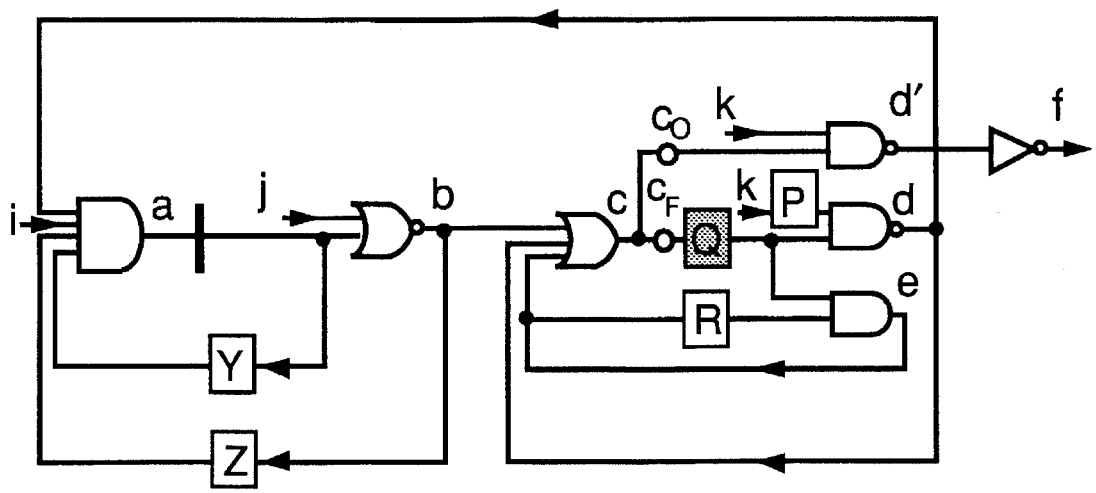
FIG. 3(c) is a schematic diagram of a modification of the circuit shown in FIG. 3(a) after scanning the flip-flop driven by gate c.
Figure 3D:
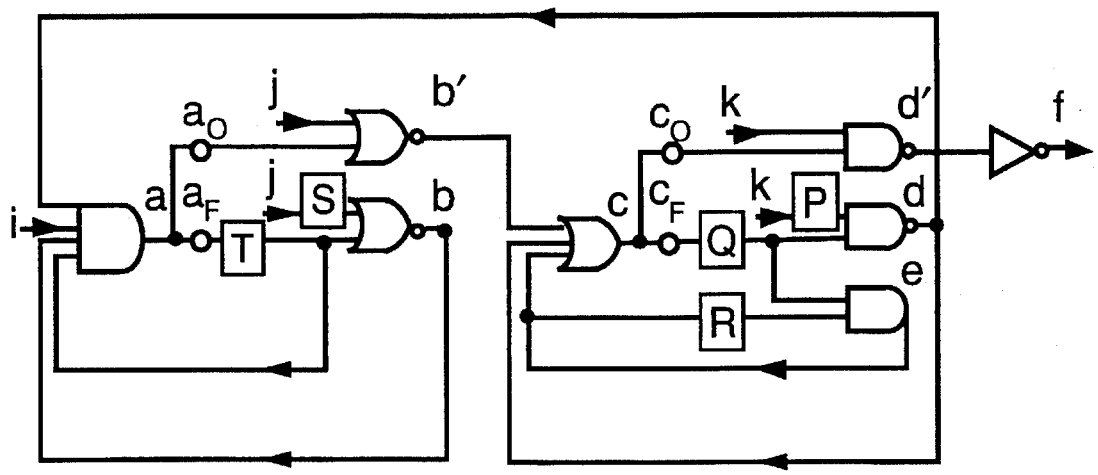
FIG. 3(d) is a schematic diagram of a retimed circuit of the circuit shown in FIG. 3(a) which satisfies all scan constraints.

The circuit shown in FIG. 3(a) demonstrates the application of cycle splitting. The minimum set of CMFVS vertices needed for the circuit in FIG. 3(a) is {a,c}, shown by the cuts. The basic cycle C=(X,a, b, c,d,X) has two CMFVS vertices to be satisfied, but has only one FF, X, available. That is, m=2, n=1. FIG. 3(b) shows the circuit obtained by output splitting, where the new CMFVS vertex $c_F$ is satisfied (has the FF Q at its output). For the remaining CMFVS vertex a, cycle splitting is applied. In addition to the basic cycle C=(a, b, c, $c_F$, Q, d, a), vertex a belongs to the set of basic cycles S={(Y,a,V),(Z,a,b,Z)}. The longest path P from vertex a which is common to both C and S consists of only one vertex b. The path P is duplicated to get P'=(b'). The fanouts of vertex a are replaced by the two new stem vertices, $a_o$ connected to the duplicated path P', and are connected to the original path P, shown in FIG. 3(d). The fanout from b, the last vertex in path P, to c, vertex in the basic cycle C, is disconnected. At this point, the basic cycle C has been split from all other basic cycles S as required. Breaking vertex $a_F$ would break the cycles in S, and cycle C can be broken by the other CMFVS vertex, cr, that has already been satisfied. Hence, aF is made the CMFVS vertex in place of vertex a. The basic cycle C, and all other basic cycles, now satisfy condition 2 above. Condition 1 above is also satisfied. Hence, the new CMFVS vertex aF can be satisfied. FIG. 3(d) shows the resynthesized circuit with the desired CMFVS configuration obtained by a subsequent legal retiming step. Note that both the CMFVS vertices $a_F$ and $c_F$ have FFs, T and Q, at their outputs. Scanning the FFs T and Q breaks all loops, except self-loops.

All the basic cycles of the circuit can be transformed by cycle splitting such that no basic cycle contains more CMFVS vertices than the number of FFs in thereby satisfying condition 2 above.

Application of cycle splitting on each basic cycle explicitly may be computationally prohibitive. There may be an exponential number of basic cycles. Enumerating each basic cycle, and applying cycle splitting to each basic cycle that does not satisfy condition 2 above may be prohibitively expensive. Cycle splitting can be implicitly achieved on all necessary basic cycles simultaneously by a procedure involving retiming and output splitting.

It is always possible to resynthesize a circuit C to obtain a resynthesized circuit $C_R$ that satisfies the necessary and sufficient conditions 1 and 2 above.

Figure 4:
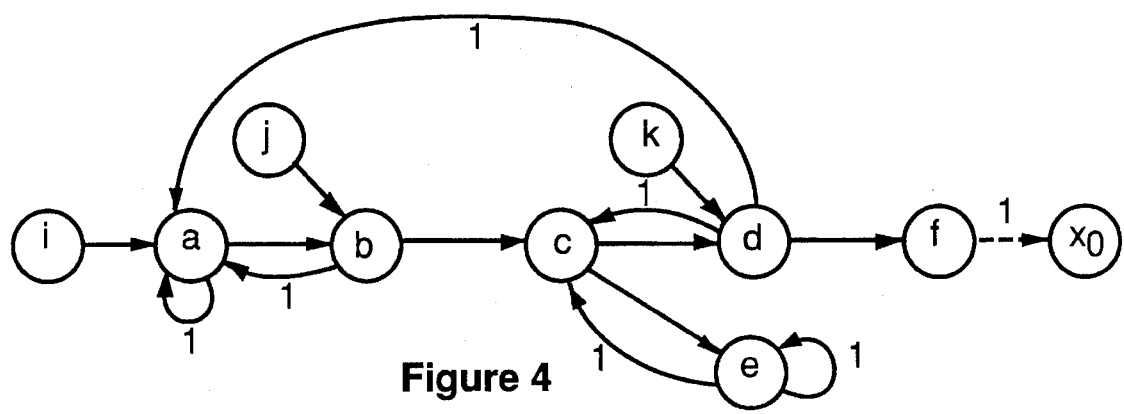
FIG. 4 is a circuit graph corresponding to the circuit shown in FIG. 3(a)

Let $v_1 \ldots v_k$ be the set of vertices in the circuit graph that have been selected as the CMFVS. If there exists a legal retiming of the circuit for which the scan constraint for every CMFVS vertex is satisfied, then the retimed circuit is the CMFVS-configuration. However, in many cases, it may not be possible to achieve CMFVS-configuration solely by retiming. For example, consider the circuit in FIG. 3(a). Its circuit graph is shown in FIG. 4. The CMFVS consists of two vertices a and c. In order to achieve the CMVFS-configuration, flip-flops are required on arcs a→$^e$1b and c→$^e$2d. However, no legal retiming can position flip-flops on both arcs because the cycle consisting of vertices a, b, c and d has only one flip-flop and retiming cannot increase the number of flip-flops in the cycle to two. However, a CMFVS-configuration can always be achieved by a combination of retiming and resynthesis. In the following description, the CMFVS-configuration is achieved by only allowing primary outputs to borrow flip-flops from the environment. If satisfying a scan constraint does require the borrowing of a flip-flop from the environment, then output splitting can be employed to obtain an equivalent circuit in which the scan constraint can be satisfied by retiming without borrowing a flip-flop. If the CMFVS-configuration cannot be attained, then an attempt is made to satisfy as many scan constraints as possible. CMFVS vertices with unsatisfied scan constraints are candidates for cycle splitting.

A network flow formulation is presented to satisfy as many scan constraints as possible. The circuit graph is modified to take into account the borrowing of a flip-flop by a primary output from the environment. An additional vertex $x_o$ is introduced. An arc is added from every primary output vertex to $x_o$ with a weight of 1. For example, consider the circuit graph shown in FIG. 4. The primary output f is connected to $x_o$ (dotted line) by an arc of weight 1. The new circuit graph is retimed in order to satisfy as many scan constraints as possible by borrowing as few flip-flops as possible from the environment. If a primary output does not borrow a flip-flop from the environment, then the arc from the primary output vertex to $x_o$ has a weight of 1. The vertex $x_o$ can be considered as the primary output of the modified circuit graph.

The problem of determining a retiming configuration which satisfies as many scan constraints as possible by borrowing flip-flops is formulated as a minimum cost network flow problem. The constraints and the objective function of the optimization problem are defined as follows.

Consideration is given to three types of constraints:
1. Retiming inequality: Every arc must have a non-negative retimed arc weight. Therefore, arc $x_i \rightarrow^e x_j$, results in the inequality $r(x_j)-r(x_i)+w(e) \geq 0$.
2. Environment inequality: The primary inputs and the vertex $x_o$ cannot borrow flip-flops from the environment. This constraint is satisfied by ensuring that the primary inputs and the vertex $x_0$ are assigned the same integer value. For every primary input $x_i$, include the following two inequalities: $x_i-x_o \geq 0$ and $x_o-x_i \geq 0$.
3. 5Scan inequality: It is desirable to have at least one flip-flop on every outgoing arc of a CMFVS vertex. If $x_i \rightarrow^e x_j$ is an outgoing arc of a CMVFS vertex $x_i$, include the following two inequalities: $x_j-x_i+w(e)+\epsilon_{ij} \geq 1$ and $\epsilon_{ij} \geq 0$, where $\epsilon_{ij}$ is an integer variable. If the scan constraint for CMVFS vertex $x_i$ is satisfied, then $\epsilon_{ij}$ assumes the value 0. Otherwise, $\epsilon_{ij}$ assumes a non-zero value to satisfy the constraint $x_j-x_i+w(e)+\epsilon_{ij} \geq 1$.

The objective function includes three parts. The primary objective is to satisfy as many scan constraints as possible. In order to achieve this goal, it is necessary to minimize the sum of $\epsilon_{ij}$ for all CMFVS vertices $x_i$. Secondary objectives are to minimize the number of flip-flops borrowed by the primary outputs and to minimize the total number of registers in the retimed circuit. Minimizing the number of flip-flops borrowed by the primary outputs amounts to minimizing the sum of all $r(x_i)-r(x_o)$ such that $x_i$ has an outgoing arc to $x_o$. Minimization of the total number of registers in the retimed circuit is achieved by minimizing the sum of the retimed arc weights on all arcs. The complete objective function is as follows: Minimize $\delta[\Sigma e_{ij}]+\gamma[\Sigma x_i \rightarrow^e x_o r(x_i) - r(x_0)] + \alpha[\delta x_i \rightarrow^e x_j r(x_j) - r(x_i) + w(e)]$, where $\alpha$, $\delta$ and $\gamma$ are constants. By choosing a $\delta$ that is significantly higher than $\alpha$ or $\gamma$, satisfying scan constraints becomes the primary objective.

As an example, consider again the circuit of FIG. 3(a). The MFVS of its FF dependency graph consists of three vertices. The four possible MFVS are as follows: {X,Y,V}, {X,Y,W}, {X,Z,V} and {X,Z,W}. The circuit graph for the circuit in FIG. 3(a) is shown in FIG. 4. The CMFVS of the circuit graph includes vertices a and c. Therefore, the circuit CMFVS is lower than the MFVS of the FF dependency graph. Since scan constraints for a and c cannot be satisfied simultaneously, an attempt is made to satisfy one of the scan constraints. The following optimization problem is formulated. The circuit graph is modified by including an arc from vertex f to a new vertex $x_0$. The new arc has a weight of 1. The modified circuit graph has thirteen arcs. The retiming inequalities corresponding to the thirteen arcs are as follows:

$r(a) - r(i) \geq 0$    $r(a) - r(b) \geq -1$    $r(a) - r(d) \geq -1$ $r(b) - r(j) \geq 0$    $r(b) - r(a) \geq 0$    $r(c) - r(b) \geq 0$ $r(c) - r(d) \geq -1$    $r(c) - r(e) \geq -1$    $r(d) - r(c) \geq 0$ $r(d) - r(k) \geq 0$    $r(f) - r(d) \geq 0$    $r(e) - r(c) \geq 0$ $r(x_0) - r(f) \geq -1$ The last inequality $r(x_o) - r(f) \geq r(f) - 1$ is due to the arc from the primary output f to $x_0$ that has the additional flip-flop added to allow primary output f to borrow a flip-flop from the environment. Since the primary inputs and $x_0$ cannot borrow flip-flops from the environment, therefore, $r(i)=r(j)=r(k)=r(x_0)$. The environment inequalities are as follows:

$r(i) - r(x_0) \geq 0$    $r(x_0) - r(i) \geq 0$ $r(j) - r(x_0) \geq 0$    $r(x_0) - r(j) \geq 0$ $r(k) - r(x_0) \geq 0$    $r(x_0) - r(k) \geq 0$ It is desirable that all outgoing arcs of vertices a and c have a flip-flop. Vertex a has only one outgoing arc (the self-loop on a can be ignored for retiming since the weight on the self-loop is the same in all legal retimings). The scan inequalities corresponding to this arc are as follows:

$r(b) - r(a) + \epsilon_{ab} \geq 1$  $\epsilon_{ab} \geq 0$

Vertex c has two outgoing arcs. The corresponding scan inequalities are as follows:

$r(d) - r(c) + \epsilon_{cd} \geq 1$  $\epsilon_{cd} \geq 0$ $r(e) - r(c) + \epsilon_{ce} \geq 1$  $\epsilon_{ce} \geq 0$ The objective function is constructed as follows. The primary objective is to satisfy the scan constraints and therefore, the term $\delta*(\delta_{ab}+\epsilon_{cd}+\epsilon_{ce})$ is included in the objective function. Since it is desirable to avoid borrowing a flip-flop from arc $f \rightarrow^3 x_0$, the term $\gamma* r(f)$ is included. A secondary goal is to minimize the number of flip-flops in the circuit. This results in the term $\alpha*(-r(i)-r(j)-r(k)+2r(a)+r(c)+r(x_0))$. Therefore, the entire objective function is as follows:

$$\text{Minimize} \quad -\delta * (\epsilon_{ab} + \epsilon_{cd} + \epsilon_{ce}) + \gamma * (r(f) - r(x_0)) +$$
$$\alpha * (-r(i) - r(j) - r(k) + 2r(a) + r(c) + r(x_0))$$

Using a $\delta=100$, $\gamma=10$ and $\alpha=1$, the solution becomes $\epsilon_{ab}=r(d)=r(e)= r(f)=1$ and all other variables assume the value 0. Since $\epsilon_{ab}=1$, therefore, the scan constraint for vertex a has not been satisfied. Also, the scan constraint for vertex c can be satisfied only by allowing the primary output f to borrow a flip-flop from the environment. The retimed circuit that satisfies the scan constraint for vertex c is shown in FIG. 3(b). This circuit is obtained by using output splitting. Note that gate d has been duplicated into a new gate d' so that the primary output f need not borrow a flip-flop from the environment.

Output splitting can be always applied to a graph so that the resynthesized circuit satisfies condition 1 above. Identifying each CMFVS node v that does not satisfy condition 1, and subsequently applying output splitting for each unsatisfied CMFVS node separately, may be expensive computationally as well as in terms of the duplicate logic required. Instead, a resynthesis procedure is disclosed which uses the rotlining formulation presented above to simultaneously implicitly identify the unsatisfied scan constraints and the logic to be duplicated for all unsatisfied CMFVS nodes.

The retiming step attempts to satisfy as many scan constraints as possible, by borrowing FFs from as few primary outputs as possible. FFs are borrowed from primary outputs to satisfy scan constraints for those CMFVS nodes which do not satisfy condition 1 above. Any CMFVS node v which has a path to a primary output, and has a fanout node w, with $r(w)>0$, is a node which does not satisfy condition 1, and is a candidate for output splitting. Let N be the unsatisfied CMFVS nodes. Let G be the sub-circuit which is the union of all the output cones of CMFVS nodes in N. Sub-circuit G can be identified by traversing the circuit from nodes in N to either primary outputs or FFs. Let $G_o$ be the subcircuit of G consisting of all the nodes and edges on all the paths from nodes in N to any primary output from which a flip-flop has been borrowed. Sub-circuit $G_o$ is identified by traversing G backwards from each primary output j with $r(j)=1$. Similarly, $G_F$ is the sub-circuit of G consisting of all the nodes and edges on all the paths from nodes in N to any FF, and can be identified by traversing G from any FF X, with $r(X)=1$. There may be a node w common to the sub-circuits $G_o$ and $G_F$. In that case, w is duplicated, and the new node w' is assigned to the sub-circuit $G_o$. If w has a fanin node outside the sub-circuit G, the fanin node is also connected to w'.

The output splitting of all unsatisfied CMFVS nodes in N is achieved by replacing the sub-circuit G by the sub-circuits $G_o$ and $G_F$. The fanouts of each node $v \in N$ are replaced by two new stem nodes, $v_o$ connecting v to $G_o$, and $v_F$ connecting v to $G_F$. The new nodes $\{v_F\}$ are made the new CMFVS nodes, replacing the unsatisfied CMFVS nodes N. At this point, the resynthesized circuit satisfies condition 1 above. For all the scan constraints of the original circuit that could be satisfied by the previous retiming step by borrowing flip-flops, the corresponding scan constraints of the resynthesized circuit can be satisfied by legal retiming, without borrowing flip-flops.

Given a sequential circuit, the following procedure RRPS (retiming and resynthesis for partial scan) uses retiming and resynthesis to obtain an equivalent circuit that satisfies as many scan constraints as possible. The input to the procedure is a sequential circuit and its CMFVS. The procedure RRPS outputs an equivalent circuit that satisfies as many scan constraints as possible.

Procedure RRPS:

1. Allow primary outputs to borrow flip-flops from the environment and satisfy as many scan constraints as possible. Use the optimization technique discussed in conjunction with retiming above to satisfy scan constraints.

2. Resynthesize the circuit so that no flip-flops have to be borrowed by the primary outputs.
3. Retiree the resynthesized circuit.

Figure 5:
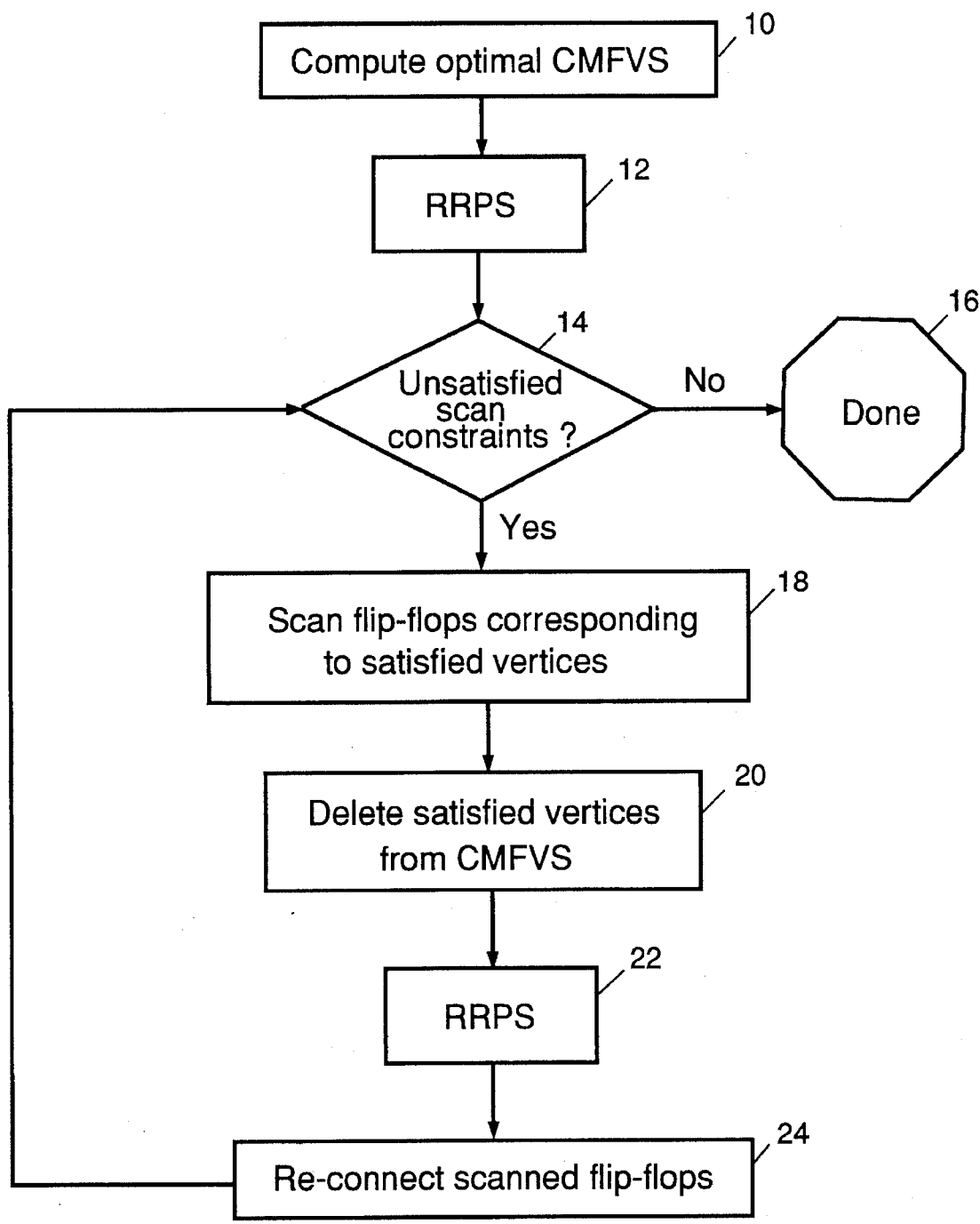
FIG. 5 is a flow diagram of the RROPS (retirelug and resynthesis for optimal partial scan) algorithm.

The algorithm RROPS (retiming and resynthesis for optimal partial scan) that uses retiming and resynthesis to obtain an equivalent circuit whose MFVS is equal to the CMFVS of the original circuit P is shown in FIG. 5. The optimal CMFVS for the given circuit is computed 10. The procedure RRPS 12 applied to the circuit P and the optimal CMFVS. If all scan constraints are satisfied 14, then there has been achieved 16 an equivalent circuit P whose MFVS is identical to the CMFVS of the original circuit.

CMFVS vertices with unsatisfied scan constraints participate in basic cycles that violate condition 2. The cycle-splitting technique can be employed to eliminate the offending basic cycles. However, it may be computationally expensive to identify all offending basic cycles. The following approach eliminates offending cycles without explicitly identifying them. Temporarily scan the flip-flops corresponding to CMFVS vertices whose scan constraints have been satisfied 18. A flip-flop is scanned by making its input signal a primary output and by making its output signal a primary input of the circuit. Let the modified circuit be $P_2$. Update the CMFVS by deleting vertices whose scan constraints have been satisfied 20. Scanning these flip-flops can result in one or more of the following situations: (1) one or more unsatisfied CMFVS vertices violate condition 1, or (2) one or more more offending cycles are broken. In the latter case, unsatisfied CMFVS vertices on the offending cycle may violate condition 1. In either case, procedure RRPS is applied again 22 to circuit $P_2$ and the modified CMFVS. In the circuit obtained after using the procedure RRPS, reconnect the flip-flops that were scanned 24 before reapplying the procedure RRPS. The result is a new circuit that satisfies more scan constraints than circuit $P_2$. These steps are repeated until all scan constraints are satisfied.

As an example, consider again the circuit shown in FIG. 3(a). Its optimal CMFVS consists of vertices a and c. If the procedure RRPS is used, it is possible to only satisfy the scan constraint for vertex c. The modified circuit that satisfies the scan constraint for vertex c is shown in FIG. 3(b). To satisfy the scan constraint for vertex a, proceed as follows. Scan flip-flop Q and obtain the circuit shown in FIG. 3(c). Note that c becomes a primary output in the modified circuit. Also delete c from the optimal CMFVS. Reapply procedure RRPS on the circuit shown in FIG. 3(c). This time the scan constraint for vertex a is also satisfied by borrowing a flip-flop at primary output c. FIG. 3(d) shows the circuit that satisfies the scan constraint for vertex a. Upon reconnecting flip-flop Q, the result is the final circuit that has an MVFS equivalent to the CMFVS of the original circuit of FIG. 3(a). In summary, the circuit in FIG. 3(a) requires three scan FFs but the equivalent circuit of FIG. 3(d) requires only two scan FFs.

The algorithm RROPS has been implemented in a C language prograph called RROPS (retiming and resynthesis for optimal partial scan). Experime results for several MCNC benchmark circuits are reported in Tables 1 and 2. All experiments were conducted on a Spare 2 workstation. RROPS uses the program PSCAN to determine the MFVS of the circuit and the circuit graph. The program PSCAN is described in a U.S. patent application entitled "Selection of Partial Scan Flip-Flops to Break Feedback Cycles" by inventors S. T. Chakradhar and A. Balakrishnan and filed concurrently herewith, which application is incorporated herein by reference. The program PSCAN implements an exact algorithm for computing the MFVS of a directed graph. It produced optimum results for all the example circuits reported here.

Table 1 shows the results of applying RROPS on the benchmark circuits. Under column Original Circuit, there is shown the total number of literals (Lits), flip-flops (FF), the size of the minimum feedback vertex set (MFVS) and the size of the minimum feedback vertex set of the circuit graph (CMFVS). Under column RROPS, there is shown the number of literals (Lits), flip-flops (FF) and the size of the minimum feedback vertex set of the retimed and resynthesized circuit produced by RROPS. Column CPU see shows the total processing time of RROPS. As an example, consider the circuit s38417. This circuit has 32246 literals and 1636 flip-flops. Its MFVS is 374 and its circuit graph has an MFVS of size 137. RROPS retirees and resynthesizes the circuit into an equivalent circuit where every CMFVS vertex drives a flip-flop. The equivalent circuit has 32277 literals, 1556 flip-flops and a MFVS of size 137. Therefore, RROPS transformed the original circuit that had an MFVS of 374 into an equivalent circuit that has an MFVS of only 141. Note that the equivalent circuit has significantly less flip-flops than the original circuit and it has only a marginal increase in the combinational logic, as measured by literals. However, for some circuits RROPS may generate an equivalent circuit that has more flip-flops.

TABLE 1

| Circuit | Original Circuit | | | | RROPS Circuit | | | CPU |
|---|---|---|---|---|---|---|---|---|
| | Lits | FF | MFVS | CMFVS | Lits | FF | MFVS | Sec. |
| mm9a | 1297 | 27 | 16 | 2 | 1498 | 41 | 2 | 0.6 |
| mm30a | 4232 | 90 | 58 | 2 | 5200 | 95 | 2 | 5.3 |
| s382 | 306 | 21 | 9 | 3 | 306 | 22 | 3 | 1.0 |
| s400 | 320 | 21 | 9 | 3 | 320 | 22 | 3 | 1.0 |
| s444 | 352 | 21 | 9 | 3 | 352 | 22 | 3 | 1.2 |
| s9234 | 7971 | 211 | 53 | 32 | 8178 | 259 | 32 | 11.3 |
| s13207 | 11234 | 638 | 58 | 34 | 11440 | 587 | 34 | 16.6 |
| s15850 | 13658 | 534 | 88 | 41 | 13911 | 569 | 41 | 20.2 |
| s38417 | 32246 | 1636 | 374 | 137 | 32277 | 1556 | 137 | 53.8 |

TABLE 2

| Circuit | Scan flip-flops | | | | |
|---|---|---|---|---|---|
| | PSCAN | LR | Opus | KT | RROPS |
| mm9a | 16 | 16 | 16 | 8 | 2 |
| mm30a | 58 | 58 | 58 | 29 | 2 |
| s382 | 9 | 9 | 9 | 9 | 3 |

TABLE 2-continued

| Circuit | Scan flip-flops | | | | |
|---|---|---|---|---|---|
| | PSCAN | LR | Opus | KT | RROPS |
| s400 | 9 | 9 | 9 | 9 | 3 |
| s444 | 9 | 9 | 9 | 9 | 3 |
| s9234 | 53 | 53 | 53 | 44 | 22 |
| s13207 | 58 | 58 | 58 | 58 | 34 |
| s15850 | 88 | 91 | 91 | 64 | 41 |
| s38417 | 374 | 380 | 384 | 363 | 137 |

Table 2 compares the performance of RROPS with four other methods for selecting scan flip-flops. Under column PSCAN, there is shown the MFVS of the original circuit obtained using the program PSCAN. Columns LR and Opus show the size of the feedback vertex sets obtained using two heuristic methods reported in an article by D. H. Lee and S. M. Reddy entitled "On Determining Scan Flip-Flops in Partial Scan Designs," in Proc. of the Int'l. Conf. on CAD, pp. 322–325, November 1990, and in an article by V. Chickermanc and J. H. Patel entitled "An Optimization Based Approach to the Partial Scan Design Problem" in Proc. of an Int'l Test Conf., pp. 377–386, September 1990, respectively. Column KT shows the size of feedback vertex sets obtained using the technique reported in an article by D. Kagaris and S. Tragoudas entitled "Partial Scan with Retiming" in Proc. Design Automation Conf., pp. 249–254, 1993. They combine retiming with a cycle-breaking technique to obtain an equivalent circuit that has a feedback vertex set that is lower than that of the original circuit. Under column Rn. oPs, there is shown the MFVS of the circuit produced by RROPs. As an example, consider again the circuit s38417. It has an MFVS of size 374. Lee and Reddy's technique computes a feedback vertex set of size 380. Opus finds a feedback vertex set of size 384. The technique by Kagaris and Tragoudas produces an equivalent circuit that has a feedback vertex set of size 363. The circuit produced by RPOPs has a MFVS of only 137. Similar results are shown for the other circuits in Table 2. The experimental results clearly show that a significant reduction in the number of scan flip-flops is possible by using RROPs.

By practicing the present invention, it is possible to reposition the FFs of a circuit using retiming and resynthesis to obtain an equivalent circuit that requires significantly fewer scan FFs than the original circuit. The MFVS of FF dependency graph of the equivalent circuit is equal to the MFVS of the original circuit. Therefore, the MFVS of the original circuit is a tight lower bound on the number of scan FFs required. The invention also identifies the necessary and sufficient conditions to be satisfied by the circuit so that retiming alone can realize the desired repositioning of FFs.

The result of applying the teachings of the present invention to a given sequential circuit is the obtaining of an equivalent circuit which includes fewer scan flip-flops. That is, fabrication of a circuit which then must be tested requires the inclusion of fewer scan flip-flops and hence, less cost associated with the partial scan testing. The lower cost results from the necessity of fewer scan flip-flops which require less circuit area and result in less performance degradation.

While there has been described and illustrated a method for resynthesizing and retiming of sequential circuits to achieve partial scan testing with fewer scan flip-flops, it will be apparent to those skilled in the art that variations and modifications are possible without deviating from the broad teachings and spirit of the present invention which shall be limited solely by the scope the claims appended hereto.

What is claimed is:

1. A method of selecting scan flip flops for partial scan testing of sequential circuits comprising the steps of:

determining a circuit minimum feedback vertex set (CMFVS) to break loops at flip flops and gates in the circuit;

if a vertex of the CMFVS has a path from a primary input or to a primary output perform output splitting transformations to the vertex by adding gates to modify the circuit;

if a basic cycle of the circuit has more CMFVS vertices than flip flops, then perform cycle splitting by adding gates to the circuit to modify the circuit so that the quantity of CMFVS vertices is not more than the quantity of the flip flops in the cycle; and selecting scan flip flops in the modified circuit corresponding to vertices in the CMFVS for partial scan testing of the circuit.

2. A method of selecting scan flip flops as set forth in claim 1, further comprising the step of performing legal retiming of the modified circuit before said selecting scan flip flops.

3. A sequential circuit modified in accordance with claim 2 and fabricated for partial scan testing of the circuit.

4. A sequential circuit modified in accordance with claim 1 and fabricated for partial scan testing of the circuit.

5. A method of selecting scan flip flops for partial scan testing of sequential circuits comprising the steps of:

(a) computing a circuit minimum feedback vertex set (CMFVS) of flip flops and gates of the circuit;

(b) applying retiming and resynthesis for partial scan (RRPS) to obtain an equivalent circuit satisfying as many scan constraints as possible;

(c) scanning flip flops corresponding to CMFVS vertices whose scan constraints have been satisfied;

(d) deleting from the CMFVS those vertices whose scan constraints have been satisfied;

(e) applying procedure RRPS to the unsatisfied CMFVS vertices and the modified circuit;

(f) reconnect the flip flops scanned in step (c) ;

(g) repeat steps (c) to (f) until all scan constraints for all CMFVS vertices have been satisfied; and (h) selecting scan flip flops in the modified circuit corresponding to vertices in the CMFVS when all scan constraints have been satisfied for partial scan testing of the circuit.

6. A sequential circuit modified in accordance with claim 5 and fabricated for partial scan testing of the circuit.

7. A method of selecting scan flip flops for partial scan testing of sequential circuits comprising the steps of:

determining a set of points of gates and flip flops in a circuit whose removal will break loops in the circuit;

if a point has a path from a primary input or to a primary output perform output splitting transformation to the point by adding additional gates to modify the circuit;

if a basic cycle of the circuit has more points than flip flops, then perform cycle splitting by adding gates to the circuit to modify the circuit so that the quantity of CMFVS vertices is not more than the quantity of the flip flops in the cycle; and selecting scan flip flops in the modified circuit corresponding to points for partial scan testing of the circuit.

8. A method of selecting scan flip flops as set forth in claim 7, further comprising the step of performing legal retiming of the modified circuit before said selecting scan flip flops.

9. A sequential circuit modified in accordance with claim 8 and fabricated for partial scan testing of the circuit.

10. A sequential circuit modified in accordance with claim 7 and fabricated for partial scan testing of the circuit.

11. A method of selecting scan flip flops for partial scan testing of sequential circuits comprising the steps of:
- (a) computing a set of points of gates and flip flops in a circuit whose removal will break all loops in the circuit;
- (b) applying retiming and resynthesis for partial scan (RRPS) to obtain an equivalent circuit where every point corresponds to a flip flop;
- (c) Scanning flip flops corresponding to points whose scan constraints have been satisfied;
- (d) deleting from the set those points whose scan constraints have been satisfied;
- (e) applying procedure RRPS to the unsatisfied points and the modified circuit;
- (f) reconnect the flip-flops scanned in step (c);
- (g) repeat steps (c) to (f) until all scan constraints for all points have been satisfied; and
- (h) selecting scan flip flops according to the modified CMFVS when all scan constraints have been satisfied for partial scan testing of the circuit.

12. A sequential circuit modified in accordance with claim 11 and fabricated for partial scan testing of the circuit.

* * * * *